United States Patent
Oh et al.

(10) Patent No.: US 9,184,417 B2
(45) Date of Patent: Nov. 10, 2015

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Jae-Hwan Oh, Yongin (KR); Won-Kyu Lee, Yongin (KR); Young-Jin Chang, Yongin (KR); Seong-Hyun Jin, Yongin (KR); Jae-Beom Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 26 days.

(21) Appl. No.: 14/024,537

(22) Filed: Sep. 11, 2013

(65) Prior Publication Data
US 2014/0131677 A1 May 15, 2014

(30) Foreign Application Priority Data
Nov. 13, 2012 (KR) ........................ 10-2012-0128372

(51) Int. Cl.
*H01L 51/56* (2006.01)
*H01L 51/52* (2006.01)
*H01L 27/32* (2006.01)

(52) U.S. Cl.
CPC ............ *H01L 51/56* (2013.01); *H01L 27/3262* (2013.01); *H01L 51/5228* (2013.01); *H01L 2251/5315* (2013.01)

(58) Field of Classification Search
CPC .......................... H01L 27/124; H01L 27/1255
USPC .......................................................... 257/40
See application file for complete search history.

(56) References Cited

U.S. PATENT DOCUMENTS

| 7,675,233 B2 * | 3/2010 | Lee ................................ 313/509 |
| 7,915,816 B2 | 3/2011 | Kashiwabara et al. |
| 2004/0108810 A1 | 6/2004 | Tsujimura et al. |
| 2007/0153180 A1 * | 7/2007 | Lim et al. ....................... 349/122 |
| 2012/0146030 A1 * | 6/2012 | You et al. ......................... 257/59 |
| 2014/0175467 A1 * | 6/2014 | Choi ................................ 257/89 |

FOREIGN PATENT DOCUMENTS

| JP | 2004-119210 | 4/2004 |
| KR | 10-2006-0080505 | 7/2006 |
| KR | 10-2012-0066492 | 6/2012 |

* cited by examiner

*Primary Examiner* — Thao X Le
*Assistant Examiner* — Patricia Reddington
(74) *Attorney, Agent, or Firm* — Christie, Parker & Hale, LLP

(57) ABSTRACT

An organic light emitting display device includes: a substrate; a thin film transistor (TFT) on the substrate and including an active layer, a gate electrode, a source electrode, and a drain electrode; an organic light emitting device including a pixel electrode that contacts at least one of the source electrode or the drain electrode of the TFT, an interlayer including a light emitting layer, and a counter electrode facing the pixel electrode, the pixel electrode, the interlayer, and the counter electrode being stacked; and a cathode contact part including a first contact layer and a second contact layer, the first contact layer being at a same layer as the active layer and being doped with ion impurities, the second contact layer including a same material as the source electrode and the drain electrode and coupling the first contact layer and the counter electrode to each other.

14 Claims, 7 Drawing Sheets

ORGANIC LIGHT EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0128372 filed on Nov. 13, 2012, in the Korean Intellectual Property Office, the disclosure of which is incorporated herein in its entirety by reference.

BACKGROUND

1. Field

Embodiments of the present invention relate to an organic light emitting display device and a method of manufacturing the same.

2. Description of Related Art

Recently, organic light emitting display devices that display images by using an organic light emitting device, which includes an organic light emitting layer between a pixel electrode and a counter electrode, have received attention.

For example, in an active organic light emitting display device with a top emission structure, the light emitted from an organic light emitting layer may be emitted toward a transparent counter electrode used as a common electrode. Accordingly, the thickness of the counter electrode may be formed as thin as possible. As its thickness is reduced, the resistance is increased and thus, a voltage drop may occur.

An active organic light emitting display device may also include fine patterns for elements such as thin film transistors (TFTs), capacitors, and various wirings. Such fine patterns may be mainly formed through a photo-lithography process.

In relation to the photo-lithography process, first, a photoresist is uniformly applied on a substrate where a pattern is to be formed, and then, exposure equipment such as a stepper may expose the photoresist. Then, the exposed photoresist is developed (e.g., in the case of a positive photoresist). After the photoresist is developed, a pattern on the substrate is etched by using the remaining photoresist, and after the pattern is formed, any unnecessary photoresist is removed. That is, a series of processes are performed.

During a process for transferring a pattern by using a mask, since a mask with a desired pattern is generally prepared first, as the number of processes using the mask is increased, manufacturing costs for mask preparation may also increase. Moreover, when the above processes (e.g., complex processes) are performed, manufacturing processes may become more complicated and manufacturing time may increase. As a result, manufacturing costs may rise.

SUMMARY

Aspects of embodiments of the present invention provide an organic light emitting display device, which is manufactured through more simple processes and which may reduce a voltage (IR) drop in a cathode, and a method of manufacturing the same.

According to an aspect of the present invention, there is provided an organic light emitting display device including: a substrate; a thin film transistor (TFT) on the substrate and including an active layer, a gate electrode, a source electrode, and a drain electrode; an organic light emitting device including a pixel electrode that contacts at least one of the source electrode or the drain electrode of the TFT, an interlayer including a light emitting layer, and a counter electrode facing the pixel electrode, the pixel electrode, the interlayer, and the counter electrode being stacked; and a cathode contact part including a first contact layer and a second contact layer, the first contact layer being at a same layer as the active layer and being doped with ion impurities, the second contact layer including a same material as the source electrode and the drain electrode and coupling the first contact layer and the counter electrode to each other.

The gate electrode may face the active layer; and a gate guard surrounding the gate electrode and dividing an area of the TFT may be arranged along a circumference of the gate electrode.

The gate guard may include a same material as the gate electrode and may be at a same layer as the gate electrode.

A portion of the active layer in an area facing the gate guard may not be doped with the ion impurities.

The source electrode and the drain electrode may contact the active layer in an impurity doped area between the gate electrode and the gate guard.

The first contact layer may be on an entire area of the substrate except for an ion impurity undoped area.

The device may further include: a capacitor first electrode at a same layer as the gate electrode; and a capacitor second electrode at a same layer as the source electrode and the drain electrode.

The active layer extending from the TFT may not be doped with the ion impurities in an area facing the capacitor first electrode.

The device may further include a third contact layer at a same layer as the pixel electrode and coupling the second contact layer and the counter electrode to each other.

The device may further include a fourth contact layer between the substrate and the first contact layer and contacting the first contact layer.

The fourth contact layer may be on an entire surface of the substrate.

The fourth contact layer may include a low-resistance metal.

The device may further include a third contact layer at a same layer as the pixel electrode and coupling the second contact layer and the counter electrode to each other.

Light emitted from the organic light emitting display device may be emitted toward the counter electrode.

The active layer may include poly silicon.

According to another aspect of the present invention, there is provided a method of manufacturing an organic light emitting device, the method including: forming an active layer on a substrate; forming a gate guard on the active layer and on a same layer as a gate electrode; forming a first contact layer by doping the active layer with ion impurities, and using the gate electrode and the gate guard as a self-aligned mask; forming a source electrode and a drain electrode, and forming a second contact layer contacting the first contact layer by using a same material as the source electrode and the drain electrode; forming a pixel electrode contacting at least one of the source electrode or the drain electrode; forming an interlayer including a light emitting layer on the pixel electrode; and forming a counter electrode contacting the second contact layer and on the interlayer.

The gate guard may surround the gate electrode to divide an area of a thin film transistor (TFT).

The method may further include: forming the active layer on an entire area of the substrate; and doping the active layer with the ion impurities.

The forming the pixel electrode may include forming a third contact layer coupling the second contact layer and the counter electrode to each other.

The method may further include: before the forming of the first contact layer, forming a fourth contact layer including a metal on the substrate; and after the forming of the first contact layer, projecting a laser beam at the substrate to couple the first contact layer and the fourth contact layer to each other.

The forming of the pixel electrode may include forming a third contact layer coupling the second contact layer and the counter electrode to each other.

The method may further include: before the forming of the first contact layer, forming a fourth contact layer including a metal on the substrate; forming an insulation layer between the fourth contact layer and the first contact layer; and coupling the first contact layer and the fourth contact layer to each other by forming a contact hole in the insulation layer.

The forming of the pixel electrode may include forming a third contact layer coupling the second contact layer and the counter electrode to each other.

The method may further include: forming a first electrode of a capacitor during the forming of the gate electrode and the gate guard; and forming a second electrode of a capacitor during the forming of the source electrode and the drain electrode.

The active layer may include poly silicon.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
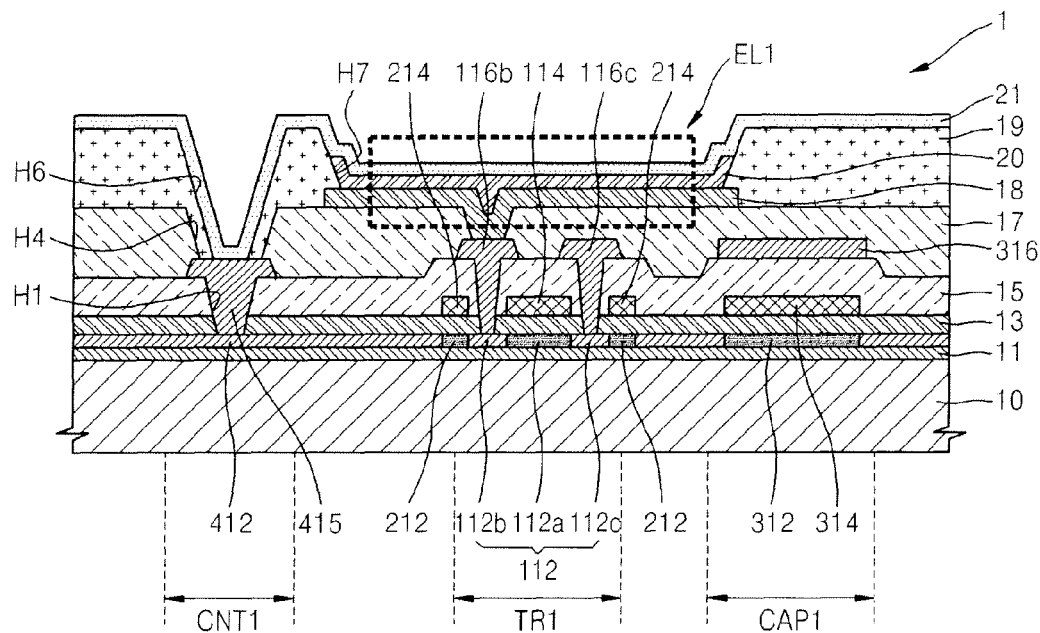
FIG. 1 is a cross-sectional view illustrating an organic light emitting display device according to a first embodiment of the present invention.

Hereinafter, embodiments of the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be more thorough and complete, and will more fully convey the concept of the invention to those skilled in the art.

In the drawings, like reference numerals denote like elements, and irrelevant components may not be illustrated in order to provide a more clear description.

Also, a first embodiment may be described by using like reference numerals for like elements, and only differences from the first embodiment may be described for other embodiments. The sizes and thicknesses of components in the drawings may be exaggerated for clarity, and thus are not limited to the sizes and thicknesses shown.

Additionally, in the drawings, the thickness or size of each layer may be exaggerated, omitted, or schematically illustrated for convenience of description and clarity. Therefore, the present invention is not limited thereto.

In the figures, the dimensions of layers and regions may be exaggerated for clarity of illustration. It will also be understood that when a layer (or film) is referred to as being 'on' another layer or substrate, it can be directly on the other layer or substrate, or intervening layers may also be present.

The terms "include," "comprise," "including," or "comprising," may be used to specify a property, a region, a fixed number, a step, a process, an element and/or a component, but do not exclude other properties, regions, fixed numbers, steps, processes, elements and/or components. In the description of embodiments, it will be understood that when a layer (or film) is referred to as being 'on/over' another layer or substrate, it can be directly on the other layer or substrate, or intervening layers may also be present. This does not necessarily mean that such layers (or films) are located based on the direction of gravity.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view illustrating an organic light emitting display device 1 according to an embodiment of the present invention.

Referring to FIG. 1, the organic light emitting display device 1 includes a transistor area TR1, a capacitor area CAP1, a cathode contact part CNT1, and an organic light emitting device EL1.

A substrate 10 may include a transparent substrate such as a glass substrate and/or a plastic substrate formed of polyethylene terephthalate (PET), polyethylene naphthalate (PEN), or polyimide.

A buffer layer 11 may be disposed (e.g., located) on the substrate 10. The buffer layer 11 for forming the flat surface on the substrate 10 and preventing the penetration of unwanted impurities may be formed of silicon nitride and/or silicon oxide with a single layer or multiple layers.

An active layer 112 may be disposed (e.g., located) on the transistor area TR1 on the buffer layer 11. The active layer 112 may be formed of a semiconductor including poly silicon. The active layer 112 may include a channel area 112a that is not ion impurity doped, and a source area 112c and a drain area 112b that are ion impurity doped around the channel area 112a.

A gate electrode 114 may be disposed (e.g., located) on the active layer 11 with a gate insulation layer 13 therebetween, corresponding to the channel area 112a of the active layer 112. Moreover, although not shown in the drawing, signal wiring such as scan signal wiring may be further formed on the gate insulation layer 13.

An interlayer insulation layer 15 may be disposed (e.g., located) on the gate electrode 114, and also, the source electrode 116c and the drain electrode 116b may be coupled to (or contact) a source area 112c and a drain area 112b, respectively, through the interlayer insulation layer 15. A planarization layer 17 may be disposed (e.g., located) on the interlayer insulation layer 15 in order to cover the source electrode 116c and the drain electrode 116b.

The drain electrode 116b may be coupled to (or contact) a pixel electrode 18 through the planarization layer 17. A counter electrode 21 may be formed on the pixel electrode 18, and an interlayer including at least an organic light emitting layer 20 may be formed between the pixel electrode 18 and the counter electrode 21.

The organic light emitting display device 1 may be classified as a top emission type or a bottom emission type according to the direction in which an image is displayed (or realized). In the top emission type, an image is displayed (or realized) toward the counter electrode 21 and in the bottom emission type, an image is displayed (or realized) toward the substrate 10. The top emission type has a higher aperture ratio than the bottom emission type. Moreover, in order to display (or realize) an image with the top emission type, the counter electrode 21 uses a transparent electrode such as indium tin oxide (ITO). However, since such a transparent electrode has high resistance in general, a voltage (IR) drop phenomenon may occur. On the other hand, when such a transparent electrode uses a metal having low resistance such as Ag or Mg, in order to improve the transmittance, a counter electrode may be formed very thin. As a result, the IR drop phenomenon may occur.

Accordingly, in order to realize the top emission type having a higher aperture ratio and lower the resistance (e.g., high resistance) of the counter electrode 21 at the same time, the organic light emitting display device 1 may include on the substrate 10 a first contact layer 412 where ion impurities are doped on the same layer as the active layer 112, in order to form the cathode contact part CNT1 that the counter electrode 21 is coupled to (or contacts). Since the first contact layer 412 is formed together with the above-mentioned active layer 112 of a TFT, it may be formed of poly silicon, and may be doped with ion impurities. Thus, its resistance may be low (e.g., very low). Accordingly, the resistance of the counter electrode 21 may be effectively reduced.

Furthermore, the counter electrode 21 may couple (or contact) the first contact layer 412 through the second contact layer 415 formed at the same layer as the source electrode 116c and the drain electrode 116b, so that the resistance of the counter electrode 21 may be further lowered. The second contact hole 415 may be formed of the same material as the source electrode 116c and the drain electrode 116b.

According to this embodiment, the IR drop in a counter electrode may be reduced (or prevented) when the top emission type organic light emitting display device 1 having a high aperture ratio is realized.

Furthermore, according to the present embodiment, the first contact layer 412 is not only formed in some areas of the cathode contact part CNT1, where the second contact layer 415 is formed on the substrate 10, but is also formed on the entire substrate 10 except some areas 212 and 312 that are not ion impurity doped.

According to an embodiment, the areas 212 that are not ion impurity doped may be a boundary between the first contact layer 412 and the active layer 112 of the TFT. Accordingly, even when the counter electrode 21 is coupled to (or contacts) the first contact layer 412, it does not affect the TFT.

Furthermore, ion impurities may be doped in the active layer 112 without an additional mask process, the first contact layer 412 may be doped with the ion impurities as well. A detailed description thereof will be described later. As a result, without adding an expensive mask process, the first contact layer 412 may be formed.

Hereinafter, a method of manufacturing the organic light emitting display device 1 of FIG. 1 will be described in more detail. FIGS. 2A to 2H are cross-sectional views illustrating a method of manufacturing the organic light emitting display device 1 according to a first embodiment of the present invention.

Figure 2A:
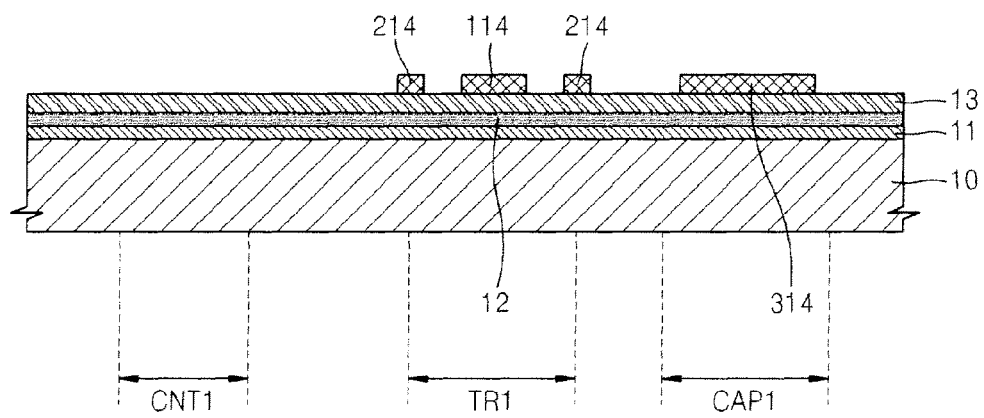
FIGS. 2A to 2H are cross-sectional views illustrating a method of manufacturing the organic light emitting display device according to a first embodiment of the present invention.

Referring to FIG. 2A, a buffer layer 11, a semiconductor layer 12, a gate insulation layer 13, and a first metal layer (not shown) may be sequentially formed on a substrate 10. Then, the first metal layer (not shown) may be patterned in order to form a gate electrode 114, a gate guard 214, and a first electrode 314 of a capacitor. In FIG. 2A, the gate guard 214 is formed to surround the gate electrode 114.

Although not shown in the drawing, the buffer layer 11, the semiconductor layer 12, the gate insulation layer 13, and the first metal layer (not shown) may be sequentially formed on a substrate 10. After a photoresist (not shown) is applied on the first metal layer (not shown), the first metal layer (not shown) may be patterned through a photo-lithography process using a first photo mask (not shown). As a result of the patterning, the above-mentioned gate electrode 114, the gate guard 214, and the first electrode 314 of the capacitor are formed. In one embodiment, a first mask process using a photo-lithography process exposes the first photo mask (not shown) to an exposure device (not shown), and then, performs a series of processes such as developing, etching, and stripping, or ashing.

A semiconductor layer 12 may be formed of amorphous silicon or poly silicon. The poly silicon may be formed by crystallizing amorphous silicon. A method of crystallizing amorphous silicon may include a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

The gate insulation layer 13 may be formed by depositing an inorganic insulation layer including SiNx or SiOx through a plasma-enhanced chemical vapor deposition (PECVD) method, an atmospheric pressure CVD (APCVD) method, or a low-pressure CVD (LPCVD) method.

Figure 2B:
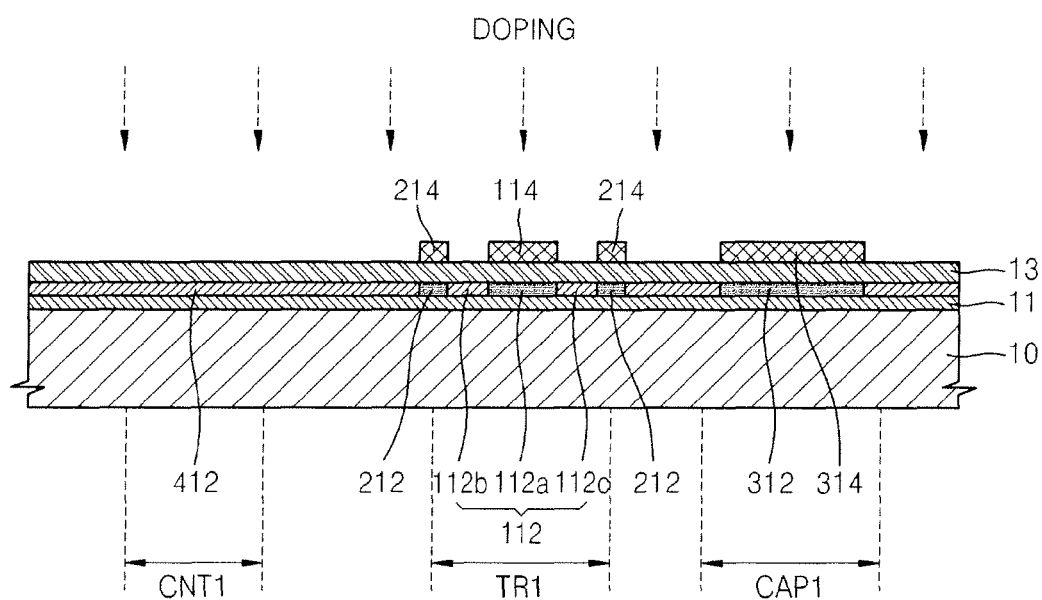
Figure 2C:
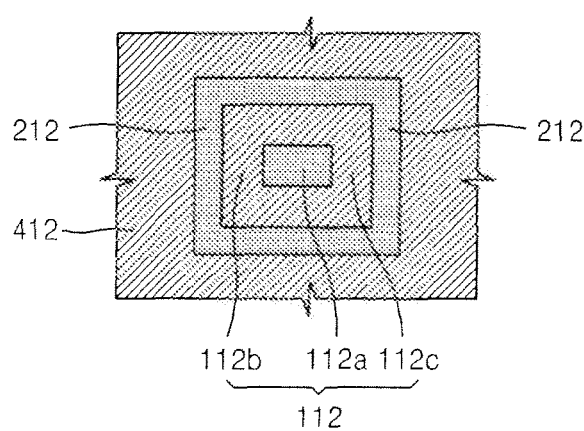

Referring to FIGS. 2B and 2C, a doping process may be performed on a result of the first mask process of FIG. 2A.

In one embodiment, the areas corresponding to the channel area 112a, and areas 212 and 312 of the semiconductor layer 12 facing the gate electrode 114, the gate guard 214, and the capacitor first electrode 314 are not doped with ion impurities, and the area corresponding to the first contact layer 412 is doped with B or P ion impurities. The area corresponding to the first contact layer 412 doped with the B or P ion impurities, except for the source area 112c and the drain area 112a, forms a first contact layer 412 of the cathode contact part CNT1.

This embodiment does not use an additional mask in order to dope the first contact layer 412 with the B or P ion impurities. The pre-patterned gate electrode 114, gate guard 214, and capacitor first electrode 314 may be used as a self-aligned mask in order to form the first contact layer 412 doped with the B or P ion impurities, without adding a mask process.

Moreover, the areas 212, which are formed on the semiconductor layer 12 so as to correspond to the gate guard 214 and are not doped with ion impurities, electrically separate the first contact layer 412 from the active layer 112 of the TFT.

Figure 2D:
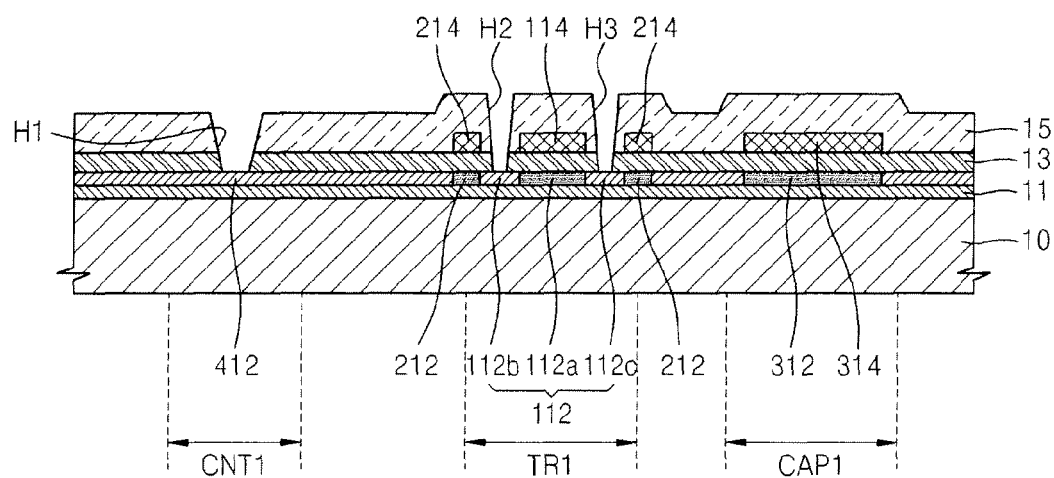

Referring to FIG. 2D, through a second mask process, an interlayer insulation layer 15 may be formed on a result of the doping process of FIG. 2B, and openings H1, H2, and H3 may be formed using a second photo mask (not shown).

The opening H1 exposes the first contact layer 412, and the openings H2 and H3 penetrate the interlayer insulation layer 15 and the gate insulation layer 13, respectively, between the gate electrode 114 and the gate guard 214, in order to expose the source area 112c and the drain area 112b.

Figure 2E:
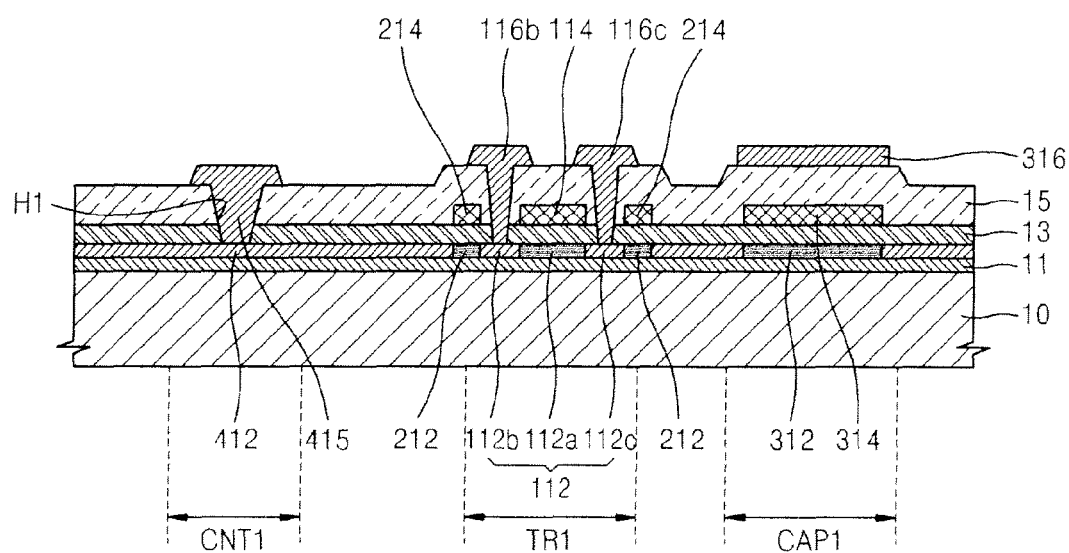

Referring to FIG. 2E, a second metal layer (not shown) may be formed on a result of the second mask process of FIG. 2D, and the second metal layer (not shown) is patterned using a third photo mask (not shown), in order to form a source electrode 116c, a drain electrode 116b, a second electrode 316 of a capacitor, and a second contact layer 415. The second contact layer 415 passes through the hole H1 in the interlayer insulation layer 15 and the gate insulation layer 13, thereby being coupled to (or contacting) the first contact layer 412.

Figure 2F:
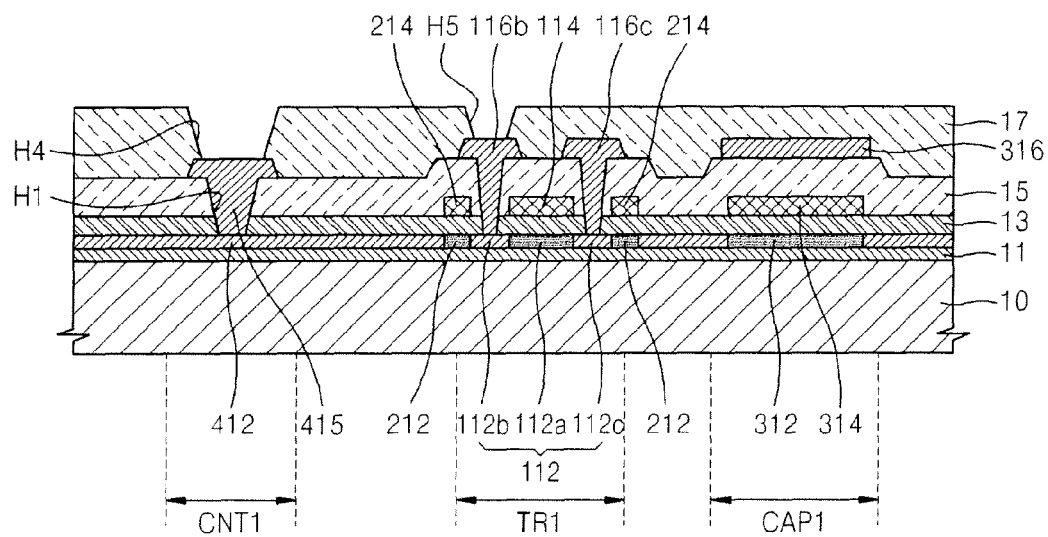

The second metal layer (not shown) may include a single layer or multi layers formed of at least one of Al, Pt, Pd, Ag, Mg, Au, Ni, Nd, Ir, Cr, Li, Ca, Mo, Ti, W, and Cu. Referring to FIG. 2F, a planarization lay 17 may be formed on a result of the third mask process of FIG. 2E, and a fourth mask process using a fourth photo mask (not shown) may be performed in order to form openings H4 and H5.

The opening H4 exposes the second contact layer 415 and the opening H5 exposes the drain electrode 116b.

Figure 2G:
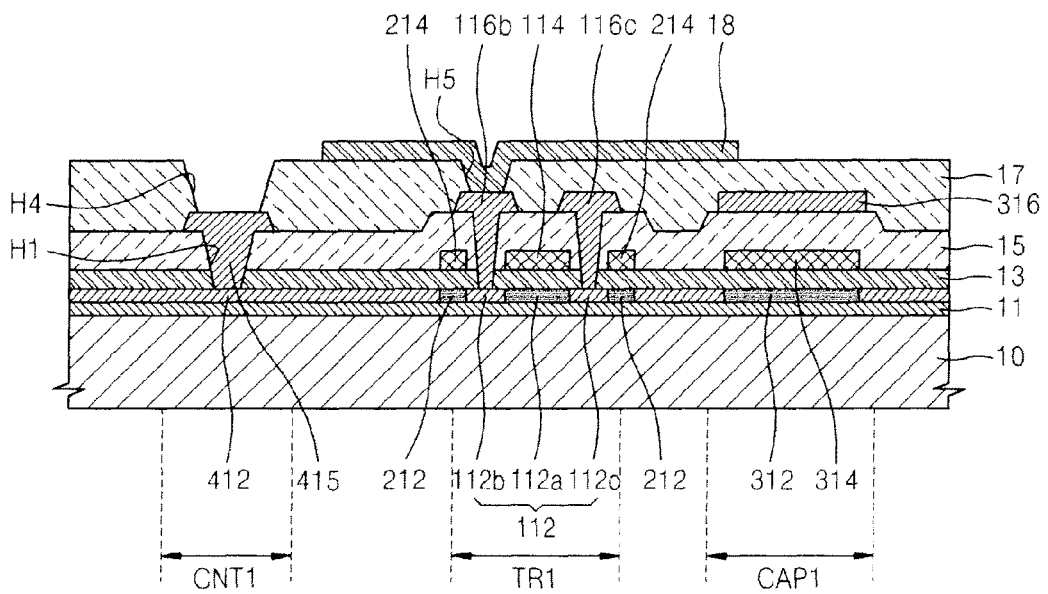

Referring to FIG. 2G, a third metal layer (not shown) may be formed on a result of the fourth mask process of FIG. 2F, and the third metal layer (not shown) may be patterned using a fifth photo mask (not shown), in order to form a pixel electrode 18. The pixel electrode 18 is coupled to (or contacts) the drain electrode 116b through the contact hole H5.

Figure 2H:
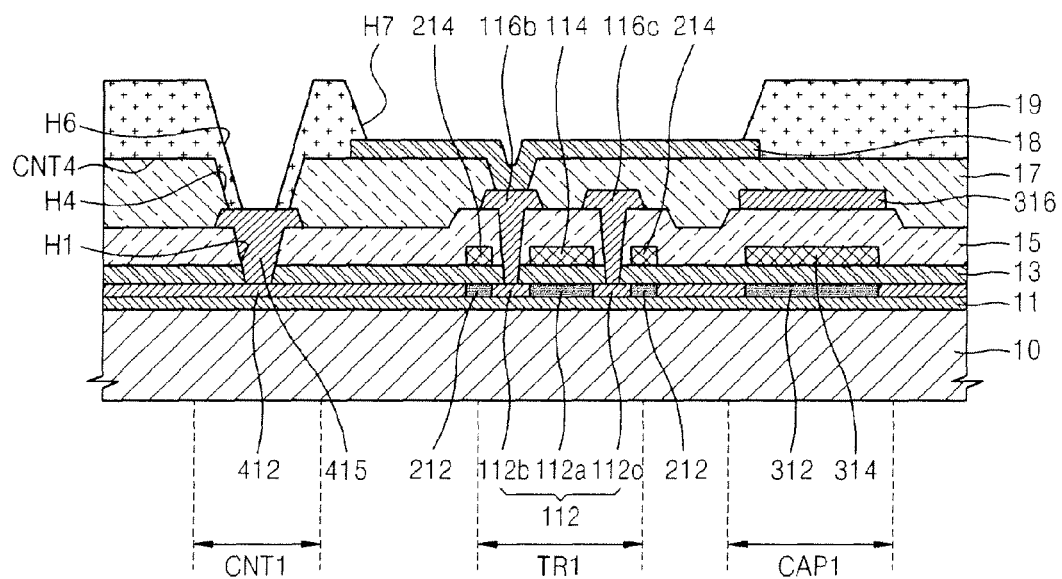

Referring to FIG. 2H, a pixel definition layer 19 may be formed on a result of the fifth mask process of FIG. 2G, and a sixth mask process using a sixth photo mask (not shown) may be performed in order to form openings H6 and H7.

The pixel definition layer 19 may be formed of at least one organic insulation material selected from the group consisting of polyimide, polyamide, acrylic resin, benzocyclobutene, and phenolic resin, through spin coating. Moreover, the pixel definition layer 19 may be formed of an inorganic insulation material such as $SiO_2$, SiNx, $Al_2O_3$, $CuO_x$, $Tb_4O_7$, $Y_2O_3$, $Nb_2O_5$, or $Pr_2O_3$, in addition to the above organic insulation material. Additionally, the pixel definition layer 19 may be formed with a multilayer structure in which an organic insulation material and an inorganic insulation material are alternately formed.

The opening H6 exposes (or opens) the second contact layer 415 and the opening H7 exposes (or opens) the pixel electrode 18.

A thickness (e.g., a predetermined thickness) of the pixel definition layer 19 increases a distance between the edge of the pixel electrode 18 and the counter electrode 21 of FIG. 1, in order to prevent the electric field from being concentrated on the edge of the pixel electrode 18. As a result, a risk of a short circuit between the pixel electrode 18 and the counter electrode 21 may be reduced (or prevented).

An interlayer (not shown) including the organic light emitting layer 20 may be formed on the opening H7 exposing the pixel electrode 18. Thereafter, the counter electrode 21 may be formed on the opening H7 exposing the pixel electrode 18 and the opening H6 exposing the second contact layer 415. Then, manufacture of the organic light emitting display device 1 of FIG. 1 may be complete.

Referring to FIG. 1, the organic light emitting layer 20 may include a low molecular weight organic material and a high molecular weight organic material (i.e., a polymer). If the organic light emitting layer 20 is formed of a low molecular weight organic material, an inter layer (not shown) may be provided, in which a hole transport layer (HTL), a hole injection layer (HIL), an electron transport layer (ETL), and an electron injection layer (EIL) are stacked. In addition, various layers may be stacked if needed. As an available organic material, copper phthalocyanine (CuPc), N'-Di(naphthalene-1-yl)-N,N'-diphenyl-benzidine (NPB), or (tris-8-hydroxyquinoline aluminium)(Alq3) may be applicable. Moreover, if the organic light emitting layer 20 is formed of a polymer, an HTL may be included in the interlayer 18. The HTL may be formed of poly-(3,4)-ethylene-dihydroxy thiophene (PEDOT) or polyaniline (PANI). As an available organic material, a polymer such as Poly-Phenylenevinylene (PPV) or Polyfluorene may be used. Thus, the organic light emitting layer 20 may include a unit pixel such as a sub pixel emitting red, green, or blue light.

In the above embodiment, the organic light emitting layer 20 is formed in the opening H7 and an additional light emitting material is formed by each pixel, but the present invention is not limited thereto. The organic light emitting layer 20 may be commonly formed on the entire planarization layer 17, regardless of the position of a pixel. For example, the organic light emitting layer may be formed by vertically stacking or mixing layers, which include a light emitting material that emits the red, green, or blue light.

The counter electrode 21 as a common electrode may be deposited on the organic light emitting layer. The counter electrode 21 may be formed as a common electrode. In the case of the organic light emitting display device according to this embodiment, the pixel electrode 18 is used as an anode electrode and the counter electrode 21 is used as a cathode electrode. However, the polarity of an electrode may be inversely applied.

In the case of the top emission type (in which an image is displayed or realized toward the opposite direction of the organic light emitting display device 1, i.e. from the substrate 10 toward the counter electrode 21), the counter electrode 21 may be a transparent (semi-transparent) electrode, and the pixel electrode 18 may be a reflective electrode. For example, the reflective electrode may be formed by thinly depositing a metal having a small work function such as Ag, Mg, Al, Pt, Pd, Au, Ni, Nd, Ir, Cr, Li, Ca, LiF/Ca, LiF/Al, or combinations thereof.

As mentioned above, in the organic light emitting display device 1 and the method of manufacturing the same of the present embodiment, by realizing the top emission type with a higher aperture ratio and forming the first contact layer 412 having ion impurities doped into the same layer as the active layer 112, the cathode contact part CNT1 coupled to (or contacting) the counter electrode 21 is formed. As a result, an IR drop in the counter electrode 21 may be reduced (or prevented). Additionally, without an additional mask process having to be performed, when the active layer 112 is doped with the ion impurities, the first contact layer 412 may be concurrently (e.g., simultaneously) doped with the ion impurities. Therefore, manufacturing costs may be reduced, and manufacturing processes may be simplified.

Hereinafter, other embodiments of the present invention will be described with reference to FIGS. 3 to 7.

Figure 3:
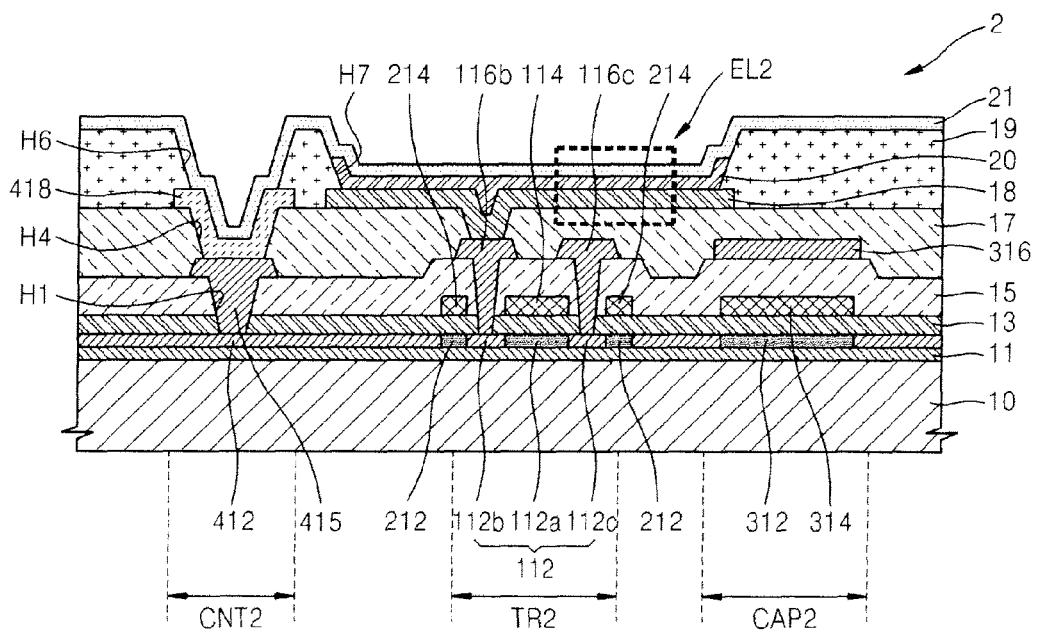
FIG. 3 is a cross-sectional view illustrating an organic light emitting display device according to a second embodiment of the present invention.

FIG. 3 is a cross-sectional view illustrating an organic light emitting display device 2 according to a second embodiment of the present invention.

Referring to FIG. 3, the organic light emitting display device 2 includes a transistor area TR2, a capacitor area CAP2, a cathode contact part CNT2, and an organic light emitting device EL2.

When compared to the first embodiment of FIG. 1, the organic light emitting device 2 according to the second embodiment further includes a third contact layer 418 on the cathode contact part CNT2 in order to allow the second contact layer 415 and the counter electrode 21 to be coupled to (or contact) each other.

The third contact layer 418 may be formed at the same layer as the pixel electrode 18. The third contact layer 418 may be formed of the same material as the pixel electrode 18.

Figure 4:
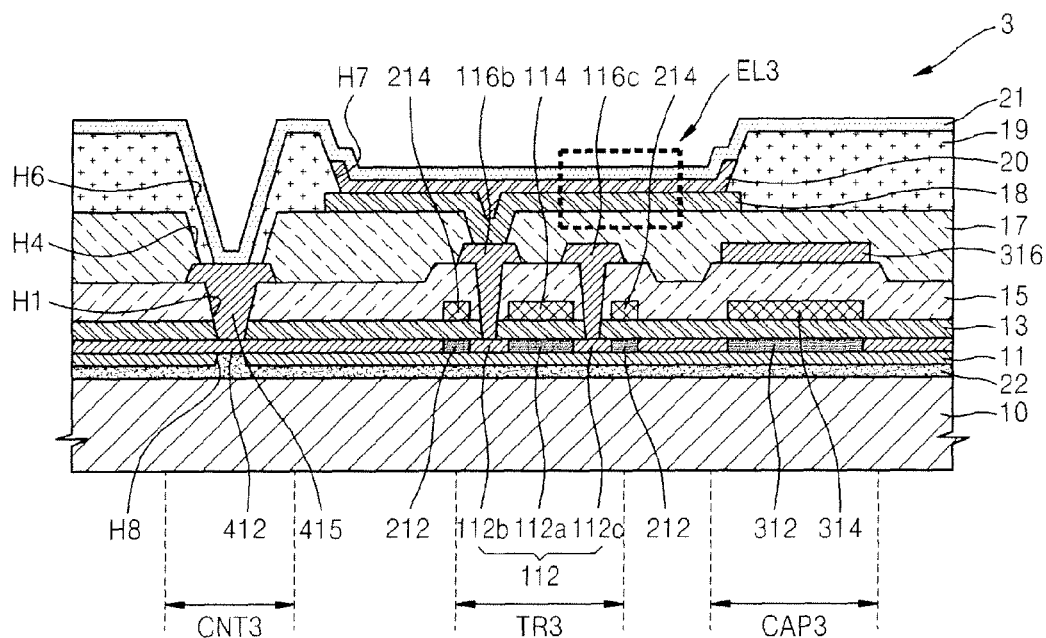
FIG. 4 is a cross-sectional view illustrating an organic light emitting display device according to a third embodiment of the present invention.

FIG. 4 is a cross-sectional view illustrating an organic light emitting display device 3 according to a third embodiment of the present invention.

Referring to FIG. 4, the organic light emitting display device 3 includes a transistor area TR3, a capacitor area CAP3, a cathode contact part CNT3, and an organic light emitting device EL3.

When compared to the first embodiment of FIG. 1, the organic light emitting device 3 according to the third embodiment further includes a fourth contact layer 22 between the substrate 10 and the first contact layer 412 in order to be coupled to (or contact) the first contact layer 412.

The fourth contact layer 22 may be formed on the entire substrate 10. The fourth contact layer 22 may be formed of a low-resistance material, so that it may further reduce (or prevent) an IR drop in the counter electrode 21.

For example, the fourth contact layer 22 and the first contact layer 412 may be coupled to (or contact) each other through the opening H8 in the buffer layer 11. This opening H8 may be formed by projecting a laser beam on the substrate 10 to melt a low-resistance metal in the fourth contact layer 22.

Figure 5:
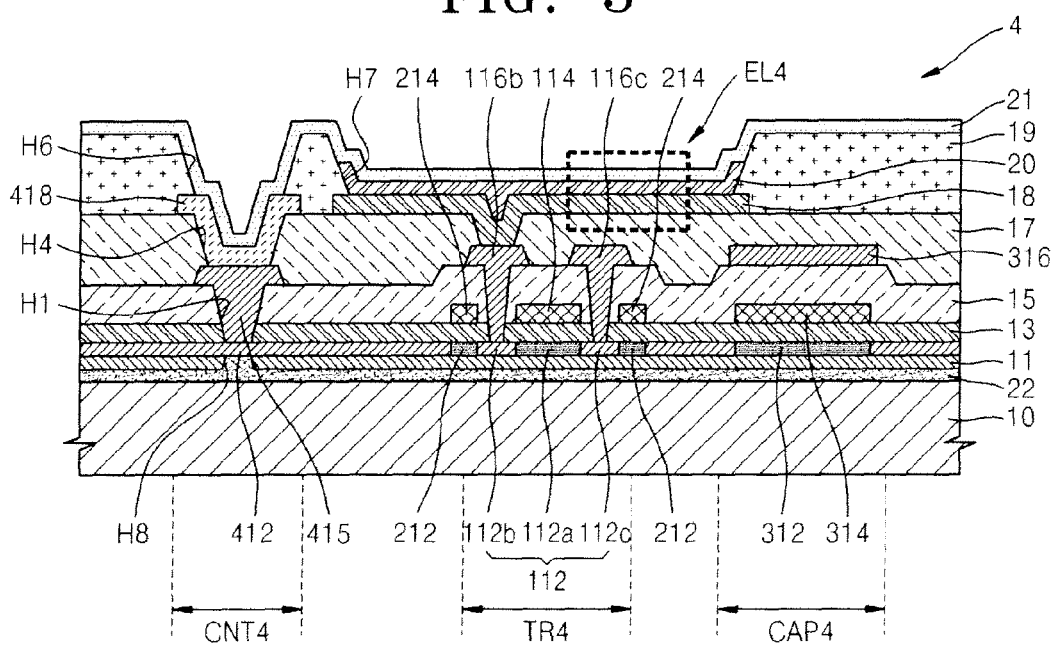
FIG. 5 is a cross-sectional view illustrating an organic light emitting display device according to a fourth embodiment of the present invention.

FIG. 5 is a cross-sectional view illustrating an organic light emitting display device 4 according to a fourth embodiment of the present invention.

Referring to FIG. 5, the organic light emitting display device 4 includes a transistor area TR4, a capacitor area CAP4, a cathode contact part CNT4, and an organic light emitting device EL4.

When compared to the third embodiment of FIG. 4, the organic light emitting device 4 according to the fourth embodiment further includes a third contact layer 418 on the cathode contact part CNT4 in order to allow the second contact layer 415 and the counter electrode 21 to be coupled to (or contact) each other. The third contact layer 418 may be formed at the same layer as the pixel electrode 18. The third contact layer 418 may be formed of the same material as the pixel electrode 18.

Figure 6:
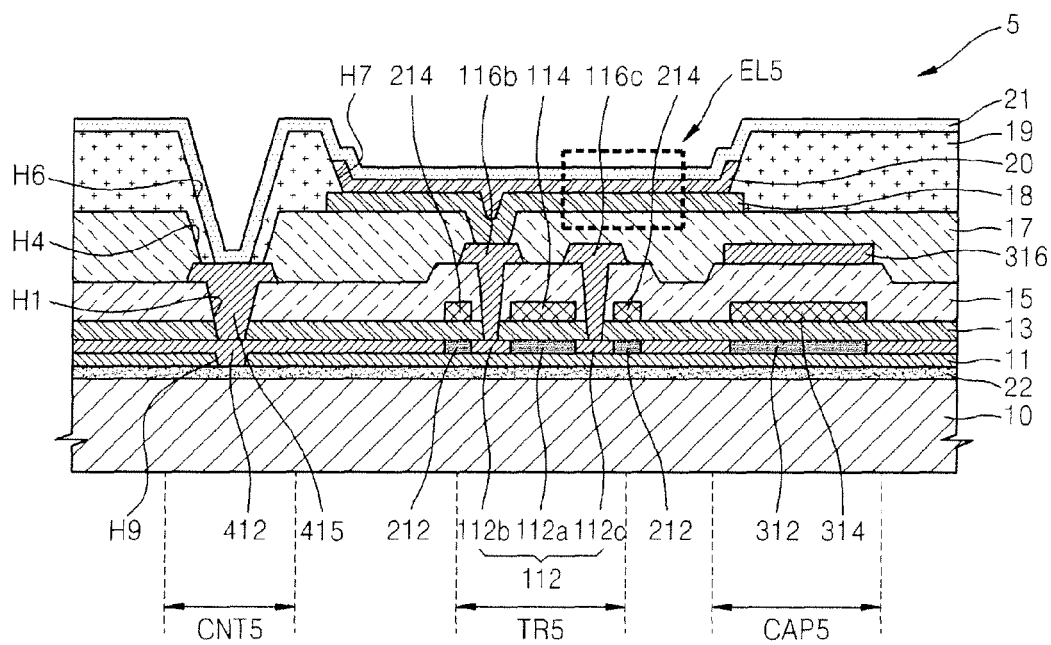
FIG. 6 is a cross-sectional view illustrating an organic light emitting display device according to a fifth embodiment of the present invention.

FIG. 6 is a cross-sectional view illustrating an organic light emitting display device 5 according to a fifth embodiment of the present invention.

Referring to FIG. 6, the organic light emitting display device 5 includes a transistor area TR5, a capacitor area CAP5, a cathode contact part CNT5, and an organic light emitting device EL5.

Like the third embodiment, the organic light emitting device 5 according to the fifth embodiment further includes a fourth contact layer 22 between the substrate 10 and the first contact layer 412 in order to be coupled to (or contact) the first contact layer 412. The fourth contact layer 22 may be formed on the entire substrate 10. The fourth contact layer 22 may be formed of low-resistance material, so that it may further reduce (or prevent) an IR drop in the counter electrode 21.

When compared with the third embodiment, in the organic light emitting display device 5 according to the fifth embodiment, the fourth contact layer 22 and the first contact layer 412 are coupled to (or contact) each other through the opening H9 in the buffer layer 11. This opening H9 may be formed by using a photo mask (not shown) used for forming the buffer layer 11 before the first contact layer 412 is formed. Although a mask process may be added, the first contact layer 412 and the fourth contact layer 22 may more accurately be coupled to (or contact) each other through the opening H9.

Figure 7:
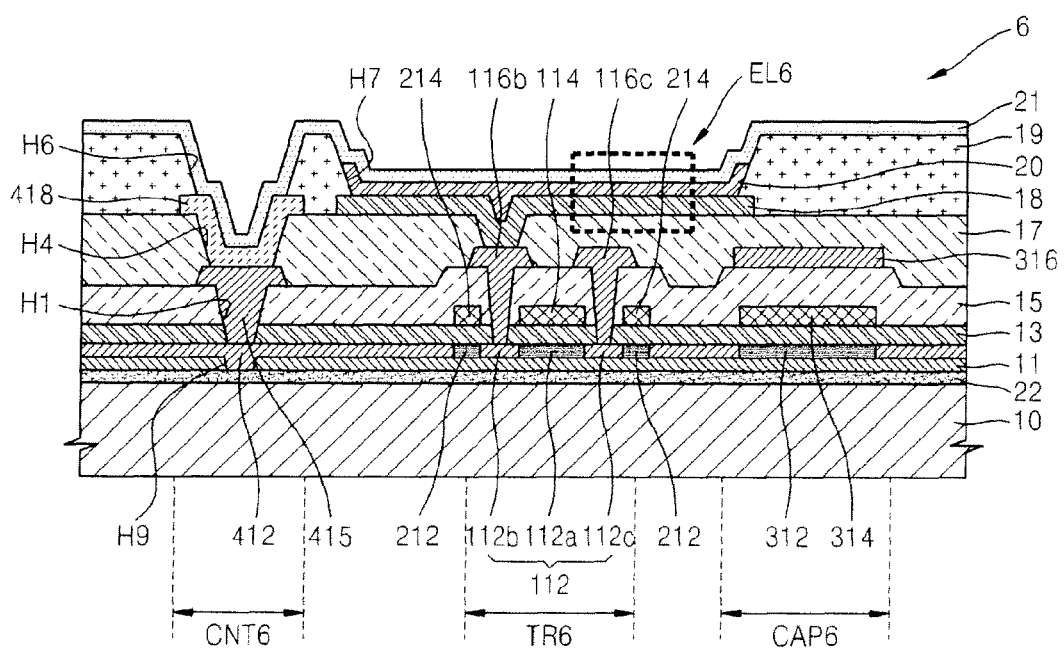
FIG. 7 is a cross-sectional view illustrating an organic light emitting display device according to a sixth embodiment of the present invention.

FIG. 7 is a cross-sectional view illustrating an organic light emitting display device 6 according to a sixth embodiment of the present invention.

Referring to FIG. 7, the organic light emitting display device 6 includes a transistor area TR6, a capacitor area CAP6, a cathode contact part CNT6, and an organic light emitting device EL6.

When compared to the fifth embodiment of FIG. 6, the organic light emitting device 6 according to the sixth embodiment further includes a third contact layer 418 on the cathode contact part CNT6 in order to allow the second contact layer 415 and the counter electrode 21 to be coupled to (or contact) each other. The third contact layer 418 may be formed at the same layer as the pixel electrode 18. The third contact layer 418 may be formed of the same material as the pixel electrode 18.

As mentioned above, in an organic light emitting display device and a method of manufacturing the same according to embodiments of the present invention, by realizing a top emission type with a higher aperture ratio and forming a first contact layer in which ion impurities are doped into the same layer as an active layer, a cathode contact part coupled to (or contacting) a counter electrode may be formed. As a result, an IR drop in the counter electrode may be reduced (or prevented). Additionally, without an additional mask process having to be performed, when the active layer is doped with the ion impurities, the first contact layer may be concurrently (e.g., simultaneously) doped with the ion impurities. Therefore, manufacturing costs may be reduced, and manufacturing processes may be simplified.

Moreover, an organic light emitting display device is described as an example in the above embodiments, but the present invention is not limited thereto. That is, various kinds of display devices including a liquid crystal display (LCD) device may be used.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light emitting display device comprising:
   a substrate;
   a thin film transistor (TFT) on the substrate and comprising an active layer, a gate electrode, a source electrode, and a drain electrode;
   an organic light emitting device comprising a pixel electrode that contacts at least one of the source electrode or the drain electrode of the TFT, an interlayer comprising a light emitting layer, and a counter electrode facing the pixel electrode, the pixel electrode, the interlayer, and the counter electrode being stacked; and
   a cathode contact part comprising a first contact layer and a second contact layer, the first contact layer being at a same layer level as the active layer and being doped with ion impurities, the second contact layer comprising a same material as the source electrode and the drain electrode and coupling the first contact layer and the counter electrode to each other, wherein the first contact layer is on an entire area of the substrate except for an ion impurity undoped area.

2. The device of claim 1, wherein
the gate electrode faces the active layer; and
a gate guard surrounding the gate electrode and dividing an area of the TFT is arranged along a circumference of the gate electrode.

3. The device of claim 2, wherein the gate guard comprises a same material as the gate electrode and is at a same layer level as the gate electrode.

4. The device of claim 2, wherein a portion of the active layer in an area facing the gate guard is not doped with the ion impurities.

5. The device of claim 2, wherein the source electrode and the drain electrode contact the active layer in an impurity doped area between the gate electrode and the gate guard.

6. The device of claim 1, further comprising:
a capacitor first electrode at a same layer as the gate electrode; and
a capacitor second electrode at a same layer as the source electrode and the drain electrode.

7. The device of claim 6, wherein the active layer extending from the TFT is not doped with the ion impurities in an area facing the capacitor first electrode.

8. The device of claim 1, further comprising a third contact layer at a same layer as the pixel electrode and coupling the second contact layer and the counter electrode to each other.

9. The device of claim 1, further comprising a fourth contact layer between the substrate and the first contact layer and contacting the first contact layer.

10. The device of claim 9, wherein the fourth contact layer is on an entire surface of the substrate.

11. The device of claim 9, wherein the fourth contact layer comprises a low-resistance metal.

12. The device of claim 9, further comprising a third contact layer at a same layer level as the pixel electrode and coupling the second contact layer and the counter electrode to each other.

13. The device of claim 1, wherein light emitted from the organic light emitting display device is emitted toward the counter electrode.

14. The device of claim 1, wherein the active layer comprises poly silicon.

* * * * *